(12) United States Patent
Shi

(10) Patent No.: US 11,581,512 B2
(45) Date of Patent: Feb. 14, 2023

(54) DISPLAY PANEL AND METHOD OF FABRICATING THE SAME

(71) Applicant: SHENZHEN CHINA STAR OPTOELECTRONICS SEMICONDUCTOR DISPLAY TECHNOLOGY CO., LTD., Guangdong (CN)

(72) Inventor: Ting Shi, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 344 days.

(21) Appl. No.: 16/620,131

(22) PCT Filed: Nov. 20, 2019

(86) PCT No.: PCT/CN2019/119728
§ 371 (c)(1),
(2) Date: Dec. 6, 2019

(87) PCT Pub. No.: WO2021/088130
PCT Pub. Date: May 14, 2021

(65) Prior Publication Data
US 2021/0359271 A1  Nov. 18, 2021

(30) Foreign Application Priority Data

Nov. 7, 2019  (CN) .......................... 201911078973.6

(51) Int. Cl.
*H01L 51/52* (2006.01)
*H01L 27/32* (2006.01)
(Continued)

(52) U.S. Cl.
CPC ...... *H01L 51/5268* (2013.01); *H01L 27/3246* (2013.01); *H01L 51/0005* (2013.01);
(Continued)

(58) Field of Classification Search
None
See application file for complete search history.

(56) References Cited

U.S. PATENT DOCUMENTS 10,707,285 B2 *  7/2020  Kwon ................. H01L 27/3218
10,991,727 B2 *  4/2021  Sim ..................... H01L 51/5262
(Continued)

FOREIGN PATENT DOCUMENTS

CN  1806338 A  7/2006
CN  1901220 A  1/2007
(Continued)

*Primary Examiner* — Michelle Mandala
(74) *Attorney, Agent, or Firm* — PV IP PC; Wei Te Chung; Ude Lu

(57) ABSTRACT

A display panel and a method of fabricating the same are provided. The display panel includes: a base substrate; a first electrode disposed on the base substrate; a hole injection layer disposed on the first electrode, wherein a surface of the hole injection layer away from the first electrode is scattering surface. In the present invention, the surface of the hole injection layer away from the first electrode is set as the scattering surface, and changes of brightness and chromaticity caused by a change of viewing angles is weakened by the scattering surface, thereby expanding viewing angles of the display panel.

9 Claims, 2 Drawing Sheets

FIG. 1

(51) Int. Cl.
*H01L 51/00* (2006.01)
*H01L 51/50* (2006.01)
*H01L 51/56* (2006.01)

(52) U.S. Cl.
CPC ...... *H01L 51/0037* (2013.01); *H01L 51/5088* (2013.01); *H01L 51/56* (2013.01); *H01L 2251/558* (2013.01)

(56) References Cited

U.S. PATENT DOCUMENTS

| | | | |
|---|---|---|---|
| 2005/0104075 A1 | 5/2005 | Evans et al. | |
| 2012/0248454 A1 | 10/2012 | Yamazaki | |
| 2014/0217372 A1 | 8/2014 | Shim et al. | |
| 2016/0155787 A1* | 6/2016 | Lee | H01L 27/3258 257/72 |
| 2020/0411799 A1 | 12/2020 | Choi et al. | |

FOREIGN PATENT DOCUMENTS

| | | | |
|---|---|---|---|
| CN | 103972261 A | 8/2014 |
| CN | 105870353 A | 8/2016 |
| CN | 109841651 A | 6/2019 |

* cited by examiner

DISPLAY PANEL AND METHOD OF FABRICATING THE SAME

FIELD OF INVENTION

The present disclosure relates to the field of display technologies, and more particularly to a display panel and a method of fabricating the same.

BACKGROUND OF INVENTION

Organic light emitting diode (OLED) display devices are also referred to as organic electric laser display devices or organic light emitting semiconductors. Working principle of an OLED is that when power is supplied to an appropriate voltage, a positive electrode hole and a second electrode charge are combined in a light emitting layer, and excitons (electron—hole pairs) in an excited state are formed by a certain probability under action of Coulomb force. This excited state is unstable in a usual environment. Excited state excitons recombine and transfer energy to a light emitting material, causing it to transition from a ground state level to an excited state. Excited state energy generates photons through process of radiation relaxation, releases light energy, produces light, and generates red, green, and blue RGB three primary colors according to different formulas to form a basic color.

OLED has advantages of low voltage demand, high power saving efficiency, fast response, light weight, thin thickness, simple structure, low cost, wide viewing angles, almost infinite contrast, low power consumption, high reaction speed, etc. and has become one of the most important display technologies available today.

In large-size OLED screens, a current mainstream structure is a bottom-emitting structure. However, as user's requirements for resolution become higher and higher, the OLED of the bottom-emitting structure is limited by an aperture ratio, and it is difficult to achieve a higher resolution. In order to achieve higher resolution, people began to turn their attention to the development of top-emitting structures.

An optical microcavity is formed between an anode and a cathode of a top light emitting device. Using the principle of optical microcavity interference enhancement, light enhancement can be achieved by adjusting a cavity length of a device. However, a strong optical microcavity structure causes the device to have an angular sensitivity. As viewing angles increase, a light intensity changes greatly, and the viewing angles of a display panel decrease. Therefore, it is necessary to find a new type of display panel to solve the above issues.

SUMMARY OF INVENTION

An object of the present invention is to provide a display panel and a method for fabricating the same, which can solve issues that an existing display panel has a large change in light intensity, a decrease in viewing angles of a display panel, etc.

To solve the above issues, an embodiment of the present invention provides a display panel comprising: a base substrate; a first electrode disposed on the base substrate; and a hole injection layer disposed on the first electrode, wherein a surface of the hole injection layer away from the first electrode is a scattering surface.

In an embodiment of the present invention, the display panel further comprises: at least one pixel barrier layer disposed on the base substrate on both sides of the first electrode; wherein the hole injection layer is disposed on the first electrode between adjacent pixel barrier layers; a hole transport layer disposed on the hole injection layer; a light emitting layer disposed on the hole transport layer; and a second electrode disposed on the light emitting layer and extending onto the at least one pixel barrier layer.

In an embodiment of the present invention, a shape of the scattering surface comprises one or more of a zigzag shape and a wave shape.

In an embodiment of the present invention, a thickness of the hole injection layer ranges between 10 nm and 150 nm.

In an embodiment of the present invention, material of the hole injection layer comprises poly(3,4-ethylenedioxythiophene): poly(styrene sulfonic acid).

An embodiment of the present invention further provides a method of fabricating the display panel according to the present invention, comprising steps of: providing the base substrate; forming the first electrode on the base substrate; and forming the hole injection layer on the first electrode; wherein the surface of the hole injection layer away from the first electrode is the scattering surface.

In an embodiment of the present invention, after forming the first electrode, the method further comprises steps of: depositing a pixel barrier layer material on the base substrate and the first electrode, and removing pixel barrier layer material formed correspondingly on the first electrode to form at least one pixel barrier layer disposed on the base substrate on both sides of the first electrode; and in the step of forming the hole injection layer, printing a hole injection layer ink on the first electrode between adjacent pixel barrier layers by an inkjet printing technique, and performing a vacuum drying to form the hole injection layer.

In an embodiment of the present invention, after the step of forming the hole injection layer, the method further comprises steps of: forming a hole transport layer on the hole injection layer; forming a light emitting layer on the hole transport layer; and forming a second electrode on the light emitting layer, and the second electrode extending onto the at least one pixel barrier layer.

In an embodiment of the present invention, in the step of forming the hole transport layer, the hole transport layer is formed by the inkjet printing technique or a vacuum evaporation technique; in the step of forming the light emitting layer, the light emitting layer is formed by the inkjet printing technique or the vacuum evaporation technique.

In an embodiment of the present invention, the hole injection layer ink comprises: a first material, a second material, and a solvent; a solubility of the first material in the solvent is greater than 10 mg/ml, and a solubility of the second material in the solvent is less than 5 mg/ml.

Beneficial effects of the present application are that: a display panel and a method of fabricating the same of embodiments of the present invention are provided. In an embodiment of the present invention, the surface of the hole injection layer away from the first electrode is set as the scattering surface, and changes of brightness and chromaticity caused by a change of viewing angles is weakened by the scattering surface, thereby expanding viewing angles of the display panel.

DESCRIPTION OF DRAWINGS

In order to more clearly illustrate the embodiments or the technical solutions in the prior art, the drawings to be used in the embodiments or the prior art description will be briefly described below. Obviously, the drawings in the following description are only some embodiments of the invention. Other drawings from these figures may also be obtained from those of ordinary skill in the art without undue creative effort.

Figure 1:
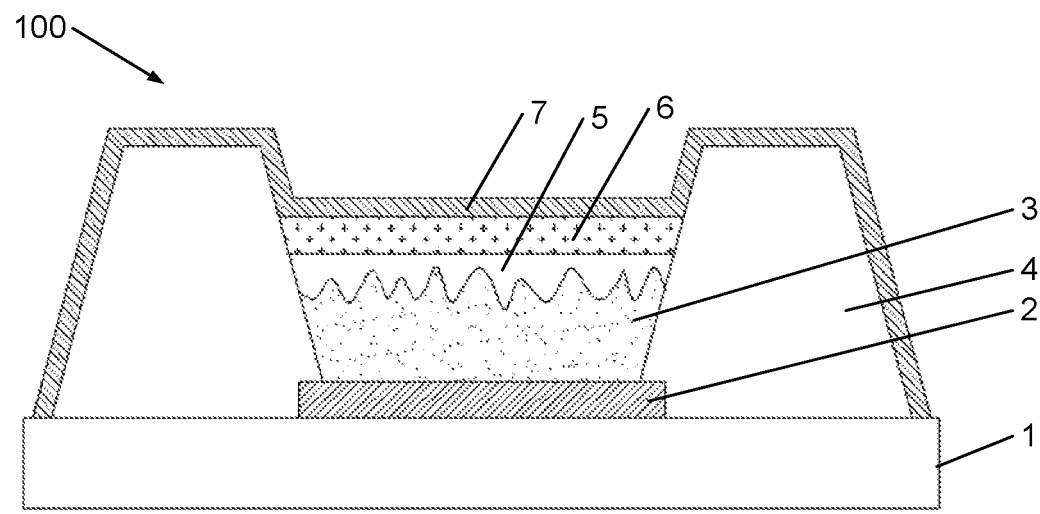
FIG. 1 is a schematic view showing a structure of a display panel according to an embodiment of the present invention.

The parts in the figures are identified as follows:
100 display panel
1 base substrate, 2 first electrode
3 hole injection layer, 4 pixel barrier layer
5 hole transport layer, 6 light emitting layer
7 second electrode

DETAILED DESCRIPTION OF PREFERRED EMBODIMENTS

The preferred embodiments of the present invention will be described in detail below with reference to the accompanying drawings, in which the present invention can be implemented by way of example to make the technical content of the present disclosure clearer. It will be easier for those skilled in the art to understand how to implement the present invention. However, the present invention can be embodied in many different forms of embodiments. The protection scope of the present invention is not limited to the embodiments mentioned herein. The following description of the embodiments is not intended to limit the scope of the present invention.

The directional terms mentioned in the present application, such as up, down, front, back, left, right, inside, outside, side, etc., are only directions referring to the additional drawings. Therefore, the directional terminology used is for the purpose of illustration and understanding and is not intended to be limiting.

In the drawings, structurally identical components are denoted by the same reference numerals. Components that are structurally or functionally similar are denoted by similar reference numerals. Moreover, the dimensions and thickness of each component shown in the drawings are arbitrarily shown for ease of understanding and description. The present invention does not limit the size and thickness of each component.

When a component is described as "on" another component, the component can be placed directly on the other component. There may also be an intermediate component on which the component is placed and the intermediate component placed on the other component. When a component is described as "mounted to" or "connected to" another component, it can be understood as directly "mounted to" or "connected to" another component or a component is "mounted to" or "connected to" another component through an intermediate component.

Embodiment 1

As shown in FIG. 1, a display panel 100 includes a base substrate 1, a first electrode 2, a hole injection layer 3, a pixel barrier layer 4, a hole transport layer 5, a light emitting layer 6, and a second electrode 7.

The base substrate 1 includes a substrate, a buffer layer, and a thin film transistor layer. The thin film transistor layer includes film layer structures such as an active layer, a gate insulating layer, a gate layer, an interlayer insulating layer, a source/drain layer, and a planarization layer, which are not described herein.

As shown in FIG. 1, the first electrode 2 is disposed on the base substrate 1. The first electrode 2 mainly reflects light emitted from the light emitting layer 6 and emits light from the second electrode 7 to achieve a top emission performance.

As shown in FIG. 1, the hole injection layer 3 is disposed on the first electrode 2. A surface of the hole injection layer 3 away from the first electrode 2 is a scattering surface. A shape of the scattering surface includes one or more of a zigzag shape and a wave shape. The surface of the hole injection layer 3 away from the first electrode 2 is set as the scattering surface, and changes of brightness and chromaticity caused by a change of viewing angles is weakened by the scattering surface, thereby expanding viewing angles of the display panel.

The hole injection layer 3 has a thickness ranging from 10 to 150 nm. Thereby, it is possible to provide sufficient holes and electrons provided by the electron injection layer to recombine in the light emitting layer 6, thereby improving a luminous efficiency of the display panel 100.

In an embodiment of the present invention, material of the hole injection layer comprises poly(3,4-ethylenedioxythiophene): poly(styrene sulfonic acid). Therefore, the surface of the hole injection layer 3 away from the first electrode 2 can be better as the scattering surface, and changes of brightness and chromaticity caused by a change of viewing angles is weakened by the scattering surface, thereby expanding viewing angles of the display panel.

As shown in FIG. 1, the pixel barrier layer 4 is disposed on the base substrate 1 on both sides of the first electrode 2. The hole injection layer 3 is disposed on the first electrode 2 between the adjacent pixel barrier layers 4.

As shown in FIG. 1, the hole transport layer 5 is provided on the hole injection layer 3. The hole transport layer 5 controls transport of holes, thereby controlling recombination of holes with electrons in the light emitting layer 6, thereby improving luminous efficiency.

As shown in FIG. 1, the light emitting layer 6 is disposed on the hole transport layer 5.

As shown in FIG. 1, the second electrode 7 is disposed on the light emitting layer 6 and extends onto the pixel barrier layer 4. The second electrode 7 allows light emitted from the light emitting layer 6 to pass therethrough, thereby achieving a top emission performance.

Embodiment 2

An embodiment of the present invention further provides a method of fabricating the display panel 100 according to the present invention, comprising steps of: providing the base substrate 1; forming the first electrode 2 on the base substrate 1; and forming the hole injection layer 3 on the first electrode 2; wherein the surface of the hole injection layer 3 away from the first electrode 2 is the scattering surface.

In an embodiment of the present invention, after forming the first electrode 2, the method further comprises steps of: depositing material of a pixel barrier layer 4 on the base substrate 1 and the first electrode 2, and removing the material of the pixel barrier layer 4 formed correspondingly on the first electrode 2 to form at least one pixel barrier layer 4 disposed on the base substrate 1 on both sides of the first electrode 2.

In the step of forming the hole injection layer 3, printing an ink of a hole injection layer 3 on the first electrode 2 between adjacent pixel barrier layers 4 by an inkjet printing technique, and performing a vacuum drying to form the hole injection layer 3. In an embodiment of the present invention, the ink of the hole injection layer 3 comprises: a first material, a second material, and a solvent. The first material may be a small molecule HATCN, the second material may be an inorganic tungsten oxide nanoparticle, and the solvent may be an alcohol solvent, specifically methanol or butanol. A solubility of the first material in the solvent is greater than 10 mg/ml, and a solubility of the second material in the solvent is less than 5 mg/ml. Thus, the two materials having different solubility are subjected to vacuum drying, and the surface of the hole injection layer 3 away from the first electrode 2 is a scattering surface, and the change in brightness and chromaticity caused by the change of the viewing angles is weakened by the scattering surface, thereby expanding the viewing angles of the display panel.

Figure 2:
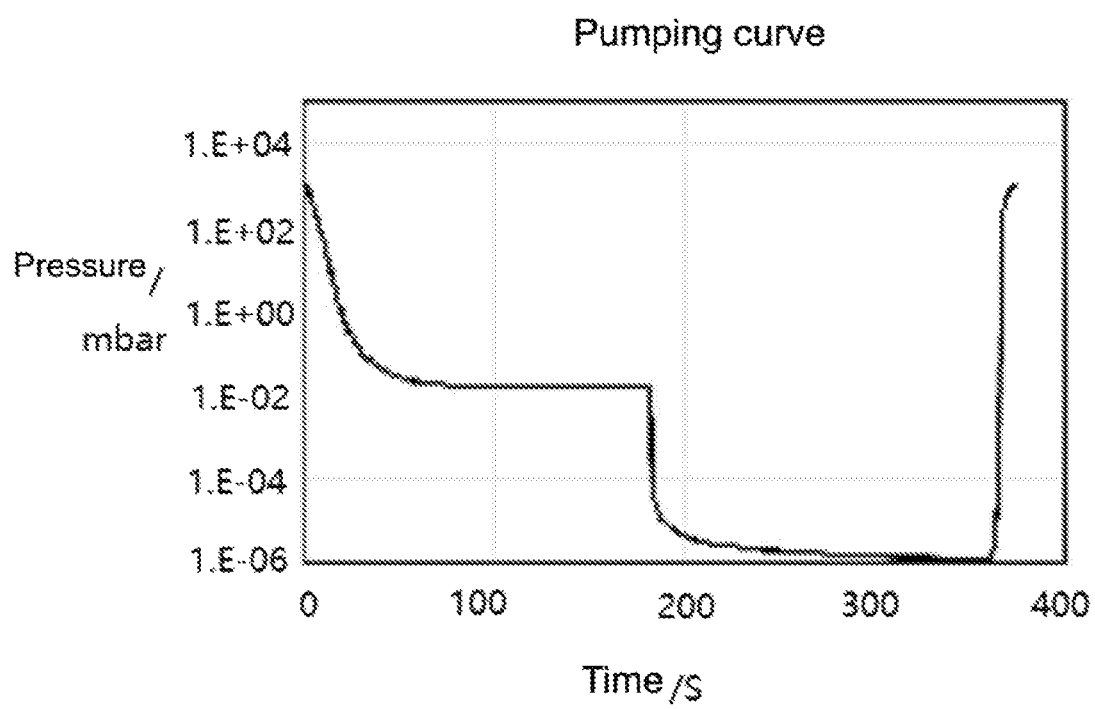
FIG. 2 is a graph of vacuum pumping rate.

As shown in FIG. 2, a vacuum drying condition is that a temperature of a stage in a vacuum chamber is lower than 5° C., and a rate of vacuum pumping is 30 s and a pressure is less than 10 Pa.

Figure 3:
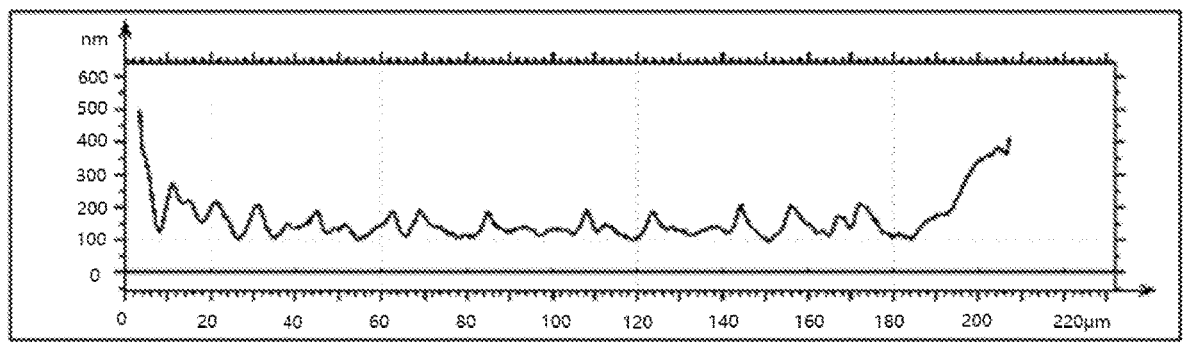
FIG. 3 is a graph showing changes in thickness of a hole injection layer.

As shown in FIG. 3, a thickness of the hole injection layer 3 at different positions is exhibited by horizontal and vertical coordinates, whereby the surface of the hole injection layer is visible as a scattering surface.

In an embodiment of the present invention, after the step of forming the hole injection layer 3, the method further comprises steps of: forming a hole transport layer 5 on the hole injection layer 3; forming a light emitting layer 6 on the hole transport layer 5; and forming a second electrode 7 on the light emitting layer 6, and the second electrode 7 extending onto the at least one pixel barrier layer.

In an embodiment of the present invention, in the step of forming the hole transport layer 5, the hole transport layer 5 is formed by the inkjet printing technique or a vacuum evaporation technique.

In the step of forming the light emitting layer 6, the light emitting layer 6 is formed by the inkjet printing technique or the vacuum evaporation technique.

The display panel and the method of fabricating the same according to embodiments of the present invention are described in detail above. It is understood that the exemplary embodiments described herein are to be considered as illustrative only, are used to help understand the method of the present invention and its core ideas, and are not intended to limit the present invention. Descriptions of features or aspects in each exemplary embodiment should generally be considered as suitable features or aspects in other exemplary embodiments. While the present invention has been described with reference to the exemplary embodiments, various modifications and changes can be made by those skilled in the art. The present invention is intended to cover such modifications and changes within the scope of the appended claims. Any modifications, equivalent substitutions, and improvements made within the spirit and scope of the present invention are intended to be included within the scope of the present invention.

What is claimed is:

1. A display panel, comprising:
    a base substrate;
    a first electrode disposed on the base substrate; and
    a hole injection layer disposed on the first electrode,
        wherein a surface of the hole injection layer away from the first electrode is a scattering surface;
        wherein a thickness of the hole injection layer is equal to 150 nm;
        wherein an ink of the hole injection layer comprises a first material, a second material, and a solvent, the first material is a small molecule HATCN, the second material is an inorganic tungsten oxide nanoparticle, and the solvent is an alcohol solvent, a solubility of the first material in the solvent is greater than 10 mg/ml, and a solubility of the second material in the solvent is less than 5 mg/ml.

2. The display panel according to claim 1, further comprising:
    at least one pixel barrier layer disposed on the base substrate on both sides of the first electrode;
    wherein the hole injection layer is disposed on the first electrode between adjacent pixel barrier layers;
    a hole transport layer disposed on the hole injection layer;
    a light emitting layer disposed on the hole transport layer; and
    a second electrode disposed on the light emitting layer and extending onto the at least ono pixel barrier layer.

3. The display panel according to claim 1, wherein a shape of the scattering surface comprises one or more of a zigzag shape and a wave shape.

4. The display panel according to claim 1, wherein material of the hole injection layer comprises poly(3,4-ethylenedioxythiophene): poly(styrene sulfonic acid).

5. A method of fabricating the display panel according to claim 1, comprising steps of:
    providing the base substrate;
    forming the first electrode on the base substrate; and
    forming the hole injection layer on the first electrode;
        wherein the surface of the hole injection layer away from the first electrode is the scattering surface.

6. The method of fabricating the display panel according to claim 5, wherein after forming the first electrode, the method further comprises steps of:
    depositing a pixel barrier layer material on the base substrate and the first electrode, and removing pixel barrier layer material formed correspondingly on the first electrode to form at least one pixel barrier layer disposed on the base substrate on both sides of the first electrode; and
    in the step of forming the hole injection layer, printing the ink of hole injection layer on the first electrode between adjacent pixel barrier layers by an inkjet printing technique, and performing a vacuum drying to form the hole injection layer.

7. The method of fabricating the display panel according to claim 6, wherein after the step of forming the hole injection layer, the method further comprises steps of:
    forming a hole transport layer on the hole injection layer;
    forming a light emitting layer on the hole transport layer; and
    forming a second electrode on the light emitting layer, and the second electrode extending onto the at least one pixel barrier layer.

8. The method of fabricating the display panel according to claim 7, wherein in the step of forming the hole transport layer, the hole transport layer is formed by the inkjet printing technique or a vacuum evaporation technique; in the step of forming the light emitting layer, the light emitting layer is formed by the inkjet printing technique or the vacuum evaporation technique.

9. The method of fabricating the display panel according to claim 1, wherein the first material and the second material having different solubilities are subjected to vacuum drying, such that the surface of the hole injection layer away from the first electrode is the scattering surface, and a vacuum drying condition of the vacuum drying is that a temperature of a stage in a vacuum chamber is lower than 5° C., and a rate of vacuum pumping is 30 seconds and a pressure is less than 10 Pa.

* * * * *